(12) United States Patent
Tanzawa

(10) Patent No.: US 9,064,551 B2
(45) Date of Patent: Jun. 23, 2015

(54) APPARATUSES AND METHODS FOR COUPLING LOAD CURRENT TO A COMMON SOURCE

(75) Inventor: Toru Tanzawa, Tokyo (JP)

(73) Assignee: Micron Technology, Inc., Boise, ID (US)

( * ) Notice: Subject to any disclaimer, the term of this patent is extended or adjusted under 35 U.S.C. 154(b) by 456 days.

(21) Appl. No.: 13/471,551

(22) Filed: May 15, 2012

(65) Prior Publication Data

US 2013/0308385 A1 Nov. 21, 2013

(51) Int. Cl.
| | | |
|---|---|---|
| G11C 16/06 | (2006.01) |
| G11C 7/08 | (2006.01) |
| G11C 7/06 | (2006.01) |
| G11C 16/26 | (2006.01) |
| G11C 16/04 | (2006.01) |

(52) U.S. Cl.
CPC ........ G11C 7/08 (2013.01); G11C 7/065 (2013.01); G11C 7/067 (2013.01); G11C 16/0483 (2013.01); G11C 16/26 (2013.01)

(58) Field of Classification Search
CPC .......... G11C 2213/82; G11C 2213/75; G11C 11/1763
USPC .................. 365/226, 185.12, 185.21
See application file for complete search history.

(56) References Cited

U.S. PATENT DOCUMENTS

| | | | |
|---|---|---|---|
| 5,784,319 A * | 7/1998 | Villa et al. ............... 365/185.33 |
| 7,023,736 B2 | 4/2006 | Cernea et al. |
| 7,057,931 B2 | 6/2006 | Lutze et al. |
| 7,893,084 B2 | 2/2011 | Beaulieu et al. |
| 7,898,317 B2 | 3/2011 | Choi |
| 7,920,431 B2 | 4/2011 | Nobunaga et al. |
| 7,995,400 B2 | 8/2011 | Sarin |
| 8,120,952 B2 | 2/2012 | Han |
| 2001/0004327 A1* | 6/2001 | Dallabora et al. ........ 365/185.23 |
| 2005/0254302 A1 | 11/2005 | Noguchi |
| 2006/0072359 A1 | 4/2006 | Futatsuyama et al. |
| 2006/0083066 A1* | 4/2006 | Hasegawa et al. ........ 365/185.18 |
| 2007/0230253 A1 | 10/2007 | Kim |
| 2009/0040832 A1 | 2/2009 | Park |
| 2011/0058427 A1* | 3/2011 | Choi et al. ............... 365/185.25 |
| 2011/0157978 A1 | 6/2011 | Shinozaki et al. |
| 2011/0164452 A1 | 7/2011 | Parker |
| 2011/0199829 A1 | 8/2011 | Lee et al. |

(Continued)

FOREIGN PATENT DOCUMENTS

| | | |
|---|---|---|
| TW | 201432698 A | 8/2014 |
| WO | WO-2014089338 A1 | 6/2014 |

OTHER PUBLICATIONS

Cernea, Raul, et al., "A 34MB/s-Program-Throughput 16Gb MLC NAND with All-Bitline Architecture in 56nm", ISSCC Session 23.1, Non-Volatile Memory, (Feb. 2008), 420-421, 624.

(Continued)

Primary Examiner — Han Yang
(74) Attorney, Agent, or Firm — Schwegman Lundberg & Woessner, P.A.

(57) ABSTRACT

Apparatuses and methods are disclosed, including an apparatus with a string of charge storage devices coupled to a common source, a first switch coupled between the string of charge storage devices and a load current source, and a second switch coupled between the load current source and the common source. Additional apparatuses and methods are described.

23 Claims, 7 Drawing Sheets

(56) References Cited

U.S. PATENT DOCUMENTS

| | | |
|---|---|---|
| 2011/0267887 A1 | 11/2011 | Sekar et al. |
| 2011/0273945 A1 | 11/2011 | Donkoh |
| 2011/0280085 A1 | 11/2011 | Damle et al. |
| 2012/0147673 A1 | 6/2012 | Nakamura et al. |
| 2012/0281471 A1 | 11/2012 | Hung et al. |
| 2013/0308387 A1 | 11/2013 | Tanzawa |
| 2014/0160851 A1 | 6/2014 | Zhao et al. |

OTHER PUBLICATIONS

Villa, Corrado, et al., "A 65 nm 1 Gb 2b/cell NOR Flash With 2.25 MB/s Program Throughput and 400 MB/s DDR Interface", IEEE Journal of Solid-State Circuits, vol. 43, No. 1, (Jan. 2008), 132-140.

Cernea, Raul, et al., "A 34MB/s-Program-Throughput 16Gb MLC NAND with All-Bitline Architecture in 65nm", ISSCC Session 23.1, Non-Volatile Memory, (Feb. 2008), 622-624.

Katsumata, R, et al., "Pipe-shaped BiCS flash memory with 16 stacked layers and multi-level-cell operation for ultra high density storage devices", 2009 Symposium on VLSI Technology, (Jun. 2009), 136-37.

Tanaka, H., et al., "Bit Cost Scalable Technology with Punch and Plug Process for Ultra High Density Flash Memory", 2007 IEEE Symposium on VLSI Technology, (2007), 14-15.

Villa, Corrado, et al., "A 65 nm 1 Gb 2b/cell NOR Flash With 2.25 MB/s Program Throughput and 400 MB/s DDR Interface", IEEE Journal of Solid-State Circuits, vol. 34, No. 1, (Jan. 2008), 132-140.

U.S. Appl. No. 13/471,539, Notice of Allowance mailed Oct. 29, 2014, 9 pgs.

U.S. Appl. No. 13/471,539, Response filed Aug. 19, 2014 to Restriction Requirement Jun. 19, 2014, 8 pgs.

U.S. Appl. No. 13/471,539, Restriction Requirement mailed Jun. 19, 2014, 5 pgs.

U.S. Appl. No. 13/707,067, Non Final Office Action mailed Jul. 31, 2014, 20 pgs.

U.S. Appl. No. 13/707,067, Response filed Oct. 31, 2014 to Non Final Office Action mailed Jul. 31, 2014, 15 pgs.

International Application Serial No. PCT/US2013/073385, International Search Report mailed Apr. 1, 2014, 4 pgs.

International Application Serial No. PCT/US2013/073385, Written Opinion mailed Apr. 1, 2014, 7 pgs.

* cited by examiner

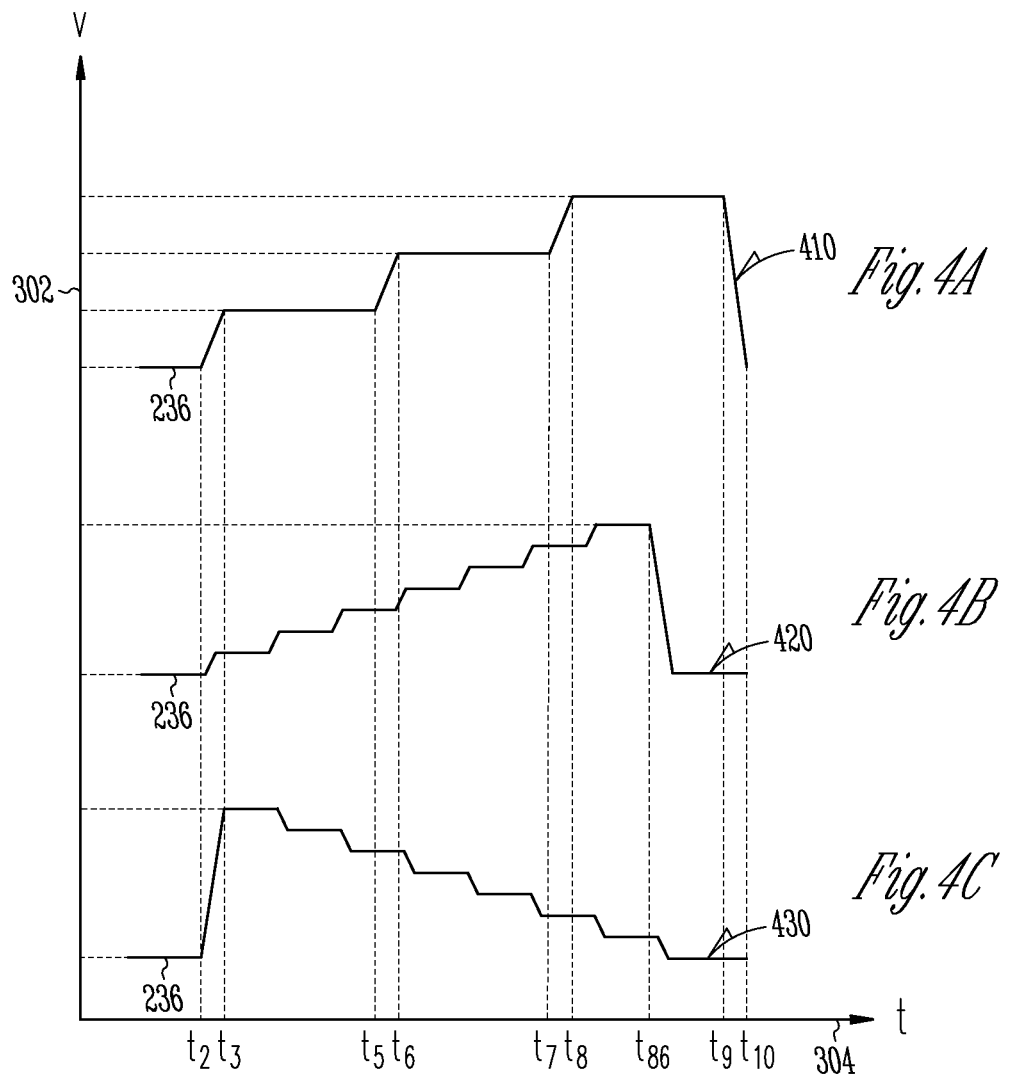

APPARATUSES AND METHODS FOR COUPLING LOAD CURRENT TO A COMMON SOURCE

BACKGROUND

Semiconductor memory devices are used in many electronic devices such as personal digital assistants (PDAs), laptop computers, mobile phones and digital cameras. Some of these semiconductor memory devices have arrays of charge storage devices.

BRIEF DESCRIPTION OF THE DRAWINGS

Some embodiments are illustrated by way of example and not limitation in the figures of the accompanying drawings in which:

FIGS. 4A, 4B and 4C are timing diagrams for the memory circuit of FIG. 2 according to various embodiments of the invention;

DETAILED DESCRIPTION

Figure 1:
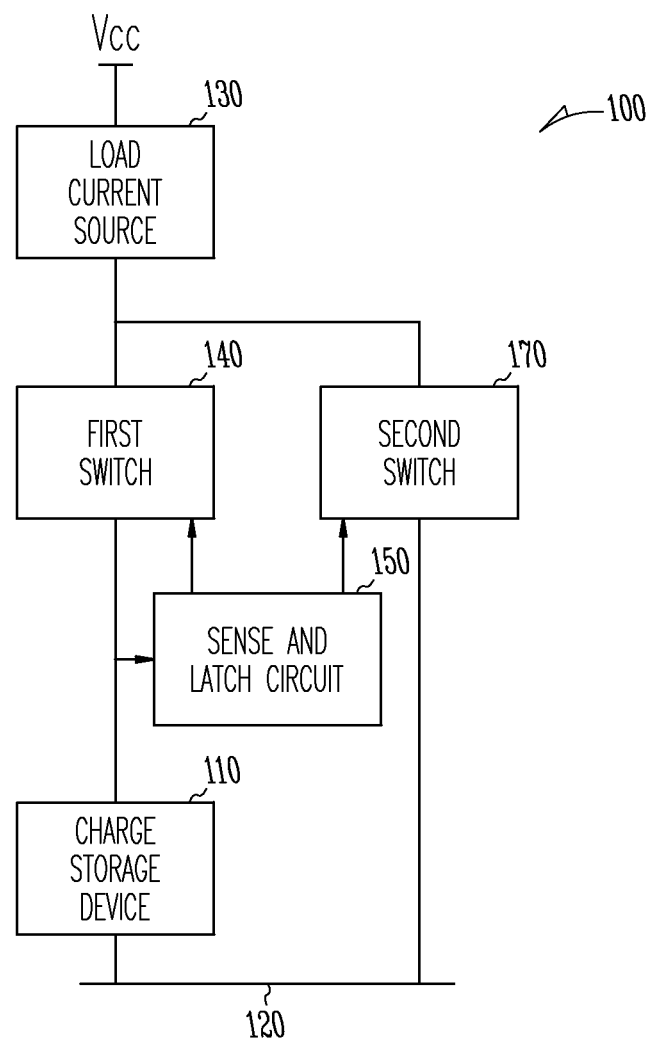
FIG. 1 is an electrical schematic diagram of an apparatus in the form of a memory circuit according to various embodiments of the invention.

An array of charge storage devices according to various embodiments of the invention may function as an array of memory cells in a memory device such as a flash memory device or a NOT AND (NAND) memory device.

For the purposes of this document, a "tier of semiconductor material" can mean semiconductor material formed in a same plane, rank, row, or unit, such as in a horizontal or vertical or sloped plane, row, rank or unit of a structure. An "apparatus" can refer to any of a number of structures, such as circuitry, a device or a system.

In this description, a charge storage device or a transistor is described as being switched on to assume an activated state when it is rendered conductive by a control gate voltage that is separated from its source voltage by at least its threshold voltage. The charge storage device or the transistor is described as being switched off to assume an inactive state when the difference between the control gate voltage and the source voltage is less than the threshold voltage, so that the charge storage device or the transistor is rendered non-conductive.

Data held by a charge storage device can be sensed by coupling a load voltage to the charge storage device and sensing a potential of the charge storage device. For example, a charge storage device can be erased to render a stored logical data value of "0." In this case, the charge storage device is conductive when sensed, allowing load current to pass to a common source (e.g., in the form of a "line" of commonly doped semiconductor material and/or other conductive material). Similarly, the charge storage device can be programmed to store a logical data value of "1." In this case, the charge storage device is non-conductive when sensed and does not allow load current to pass to the common source.

The common source has a finite impedance and its electrical potential depends on whether it receives the load current. The threshold voltage of the charge storage device depends, in part, on the electrical potential of the common source. The electrical potential of the common source is close to a reference voltage (e.g., ground voltage) when it is receiving the load current. The electrical potential of the common source can rise if it is receiving less load current because charge storage devices coupled to it have been programmed.

A rising electrical potential of the common source can change the threshold voltages of charge storage devices coupled to it. Changing threshold voltages can cause noise in a data sensing margin. The inventor has discovered that this operational challenge, as well as others, can be addressed by providing at least two parallel paths for load current to reach the common source. The load current will reach the common source through a first switch and a charge storage device if the charge storage device is conductive. The load current can also reach the common source through a second switch that can be rendered conductive when sensed and latched data indicates that the charge storage device is not conductive.

FIG. 1 is an electrical schematic diagram of an apparatus in the form of a memory circuit 100 according to various embodiments of the invention. The memory circuit 100 holds data in a charge storage device 110 coupled to a common source 120 (e.g., through a string of other charge storage devices and/or a select transistor). The common source 120 is coupled to other charge storage devices (not shown for reasons of clarity). The charge storage device 110 is coupled to receive a load current from a load current source 130 through a first switch 140. The load current source 130 is coupled to a voltage supply Vcc node.

The charge storage device 110 can be read by applying an electrical potential to its control gate and sensing an electrical potential on a drain of the charge storage device 110 receiving the load current. During a read operation, the charge storage device 110 will be conductive if it is not programmed and will be non-conductive if it is programmed. The load current from the load current source 130 will pass through the first switch 140 and the charge storage device 110 when both are conductive and be received by the common source 120.

A sense and latch circuit 150 is coupled to sense and latch a state of the charge storage device 110 when the first switch 140 is conductive and the charge storage device 110 is being read. The sense and latch circuit 150 is coupled to control a state of both the first switch 140 and a second switch 170. The second switch 170 is coupled in parallel with the first switch 140 and the charge storage device 110 between the load current source 130 and the common source 120. The sense and latch circuit 150 can switch off the first switch 140 and switch on the second switch 170 to provide the load current from the load current source 130 to the common source 120 when the charge storage device 110 is not conductive. The first switch 140 and the second switch 170 may comprise transistors according to various embodiments of the invention.

Figure 2:
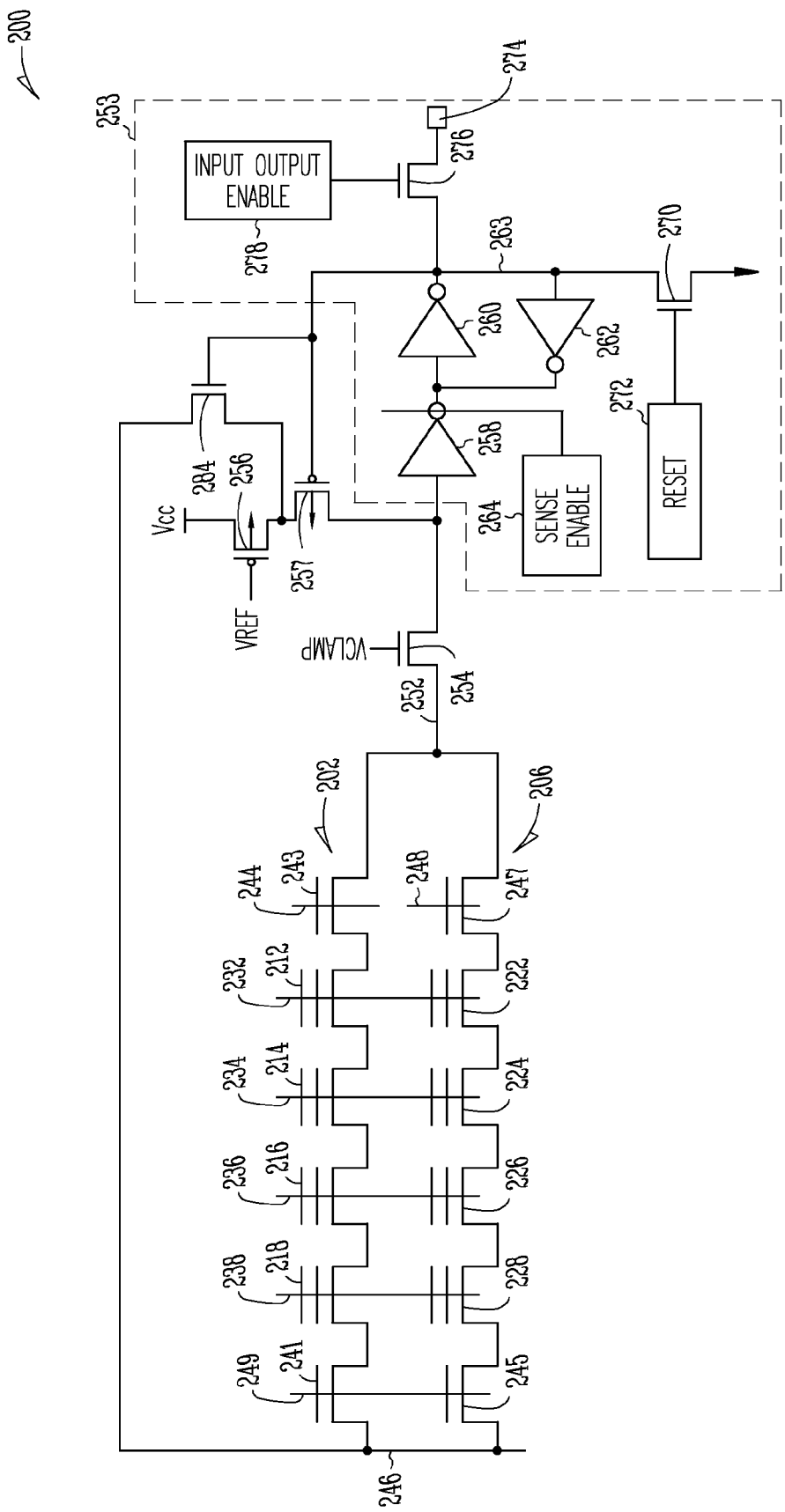
FIG. 2 is an electrical schematic diagram of an apparatus in the form of a memory circuit according to various embodiments of the invention.

FIG. 2 is an electrical schematic diagram of an apparatus in the form of a memory circuit 200 according to various embodiments of the invention. Illustrated in FIG. 2 are two strings 202 and 206 of charge storage devices. The string 202 includes four charge storage devices 212, 214, 216 and 218. The string 206 includes four charge storage devices 222, 224, 226 and 228. The strings 202 and 206 are located in an array with other strings of charge storage devices (not shown). The strings 202 and 206 can each include more than four charge storage devices, and the charge storage devices included in the strings 202, 206 may be similar to or identical to the charge storage device 110 of FIG. 1.

The strings 202 and 206 share access lines 232, 234, 236 and 238. Each of the access lines 232, 234, 236 and 238 are shown as being coupled to a pair of control gates of the charge storage devices 212 and 222, 214 and 224, 216 and 226, and 218 and 228, respectively. The charge storage devices 212 and 222 are controlled by a signal on the access line 232. The charge storage devices 214 and 224 are controlled by a signal on the access line 234. The charge storage devices 216 and 226 are controlled by a signal on the access line 236. The charge storage devices 218 and 228 are controlled by a signal on the access line 238.

The string 202 includes a source select gate (SGS) transistor 241 which is an n-channel transistor coupled between the charge storage device 218 and a common source 246. At the other end of the string 202, a drain select gate (SGD) transistor 243 is an n-channel transistor coupled between the charge storage device 212 and the rest of the memory circuit 200. A control gate of the SGD transistor 243 is coupled to an SGD line 244 having a signal that controls the SGD transistor 243 to select or deselect the string 202. The string 206 includes an SGS transistor 245 which is an n-channel transistor coupled between the charge storage device 228 and the common source 246. At the other end of the string 206, a SGD transistor 247 is an n-channel transistor coupled between the charge storage device 222 and the rest of the memory circuit 200. A control gate of the SGD transistor 247 is coupled to an SGD line 248 having a signal that controls the SGD transistor 247 to select or deselect the string 206. Control gates of the SGS transistors 241 and 245 are coupled to an SGS line 249 having a signal that controls the SGS transistors 241 and 245.

Drains of the SGD transistors 243 and 247 are coupled together to a data (e.g., bit) line 252, which is in turn coupled to a sense and latch circuit 253 through an n-channel bias transistor 254. The bias transistor 254 has a source coupled to the data line 252. The bias transistor 254 has a drain coupled to a drain of a first switch, such as a first select transistor 257, and an input of a triggered inverter 258. A source of the first select transistor 257 is coupled to a drain of a load current source, such as a p-channel load transistor 256. The first select transistor 257 is shown as a p-channel transistor. The load transistor 256 has a source coupled to a voltage supply Vcc node. A control signal VCLAMP is coupled to a control gate of the bias transistor 254, and a control signal VREF is coupled to a control gate of the load transistor 256.

A data signal from the data line 252 is coupled to the input of the triggered inverter 258 when the bias transistor 254 is rendered conductive by the control signal VCLAMP. An output of the triggered inverter 258 is coupled to an input of a first latch inverter 260 and an output of a second latch inverter 262. An output of the first latch inverter 260 is coupled to an input of the second latch inverter 262 through a node 263 such that the latch inverters 260 and 262 latch a state of a data signal provided through the triggered inverter 258 on the node 263.

The state of the data signal on data line 252 is provided through the triggered inverter 258 and latched by the latch inverters 260 and 262 when the triggered inverter 258 is enabled by a pulse produced by a sense enable circuit 264. A state latched by the latch inverters 260 and 262 is reset when an n-channel reset transistor 270 is rendered conductive by a signal from a reset circuit 272 to couple the node 263 to a reference voltage (e.g., ground voltage) node. The state latched by the latch inverters 260 and 262 on the node 263 is coupled to an input and output (I/O) node (e.g., pad) 274 when an n-channel I/O transistor 276 is rendered conductive by a signal from an I/O enable circuit 278.

The node 263 is coupled to a gate of the first select transistor 257 and a gate of a second switch, such as a second select transistor 284. The second select transistor 284 is an n-channel transistor having a drain coupled to the source of the first select transistor 257 and the drain of the load transistor 256. A source of the second select transistor 284 is coupled to the common source 246.

States of the first select transistor 257 and the second select transistor 284 are controlled by the state of the data signal on the data line 252, as latched by the latch inverters 260 and 262. If the state latched by the latch inverters 260 and 262 on the node 263 is low, the first select transistor 257 is rendered conductive to provide a current path from the load transistor 256 through the bias transistor 254 to the strings 202 and 206 while the second select transistor 284 is switched off. If the state latched by the latch inverters 260 and 262 on the node 263 is high, the second select transistor 284 is rendered conductive to provide a current path from the load transistor 256 to the common source 246 while the first select transistor 257 is switched off. As a result, the load current is diverted to the common source 246 when it cannot pass through the strings 202 and 206.

The strings 202 and 206 of charge storage devices may be located in an array of charge storage devices. The triggered inverter 258, the sense enable circuit 264, the latch inverters 260 and 262, the node 263, the reset transistor 270, the reset circuit 272, the I/O node 274, the I/O transistor 276 and/or the I/O enable circuit 278 can be part of the sense and latch circuit 253 coupled to the array of charge storage devices through the bias transistor 254 and the data line 252. There can be more than two strings of charge storage devices coupled to be read by the sense and latch circuit 253 through the bias transistor 254 and the data line 252. The common source 246 may be coupled to other strings of charge storage devices (not shown).

Figure 3:
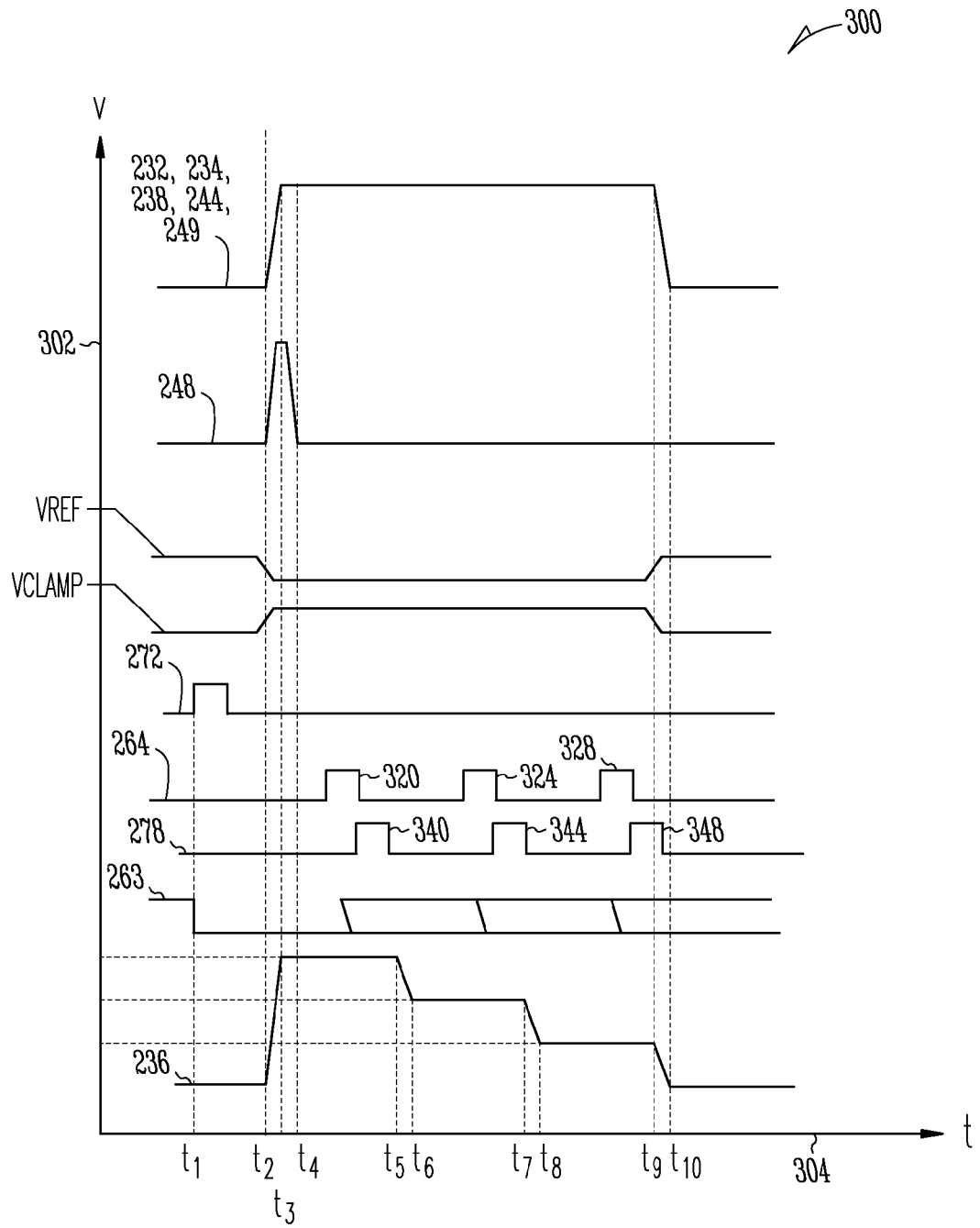
FIG. 3 is a timing diagram for the memory circuit of FIG. 2 according to various embodiments of the invention.

FIG. 3 is a timing diagram 300 for the memory circuit 200 of FIG. 2 according to various embodiments of the invention. The timing diagram 300 illustrates signals and electrical potentials in the memory circuit 200 during a read operation for the charge storage device 216. The signals and electrical potentials are represented by voltage V on a vertical axis 302 and time t on a horizontal axis 304.

To begin, and referring now to FIGS. 2 and 3, the reset circuit 272 produces a pulse beginning at time t1 to switch on the n-channel reset transistor 270 to couple the node 263 to a reference voltage (e.g., ground voltage) node to reset the state latched by the latch inverters 260 and 262. Each pulse described herein can comprise a raised electrical potential of a limited duration.

The control signal VREF can be reduced from approximately 2 volts to approximately 0.5 volts for the entire read operation to render the load transistor 256 conductive. In addition, the control signal VCLAMP can be raised from about 0 volts to about 1.5 volts to render the bias transistor 254 conductive for the entire read operation, such that the data line 252 and the string 202 are charged from the voltage supply Vcc node.

The SGD line 248 can be raised from approximately 0 volts at time t2 to approximately 5 volts at time t3 and then reduced to approximately 0 volts at time t4 for the remainder of the read operation to switch off the SGD transistor 247 to substantially electrically isolate the string 206 from the data line 252 to deselect the string 206. The access lines 232, 234 and 238 can be raised from about 0 volts at time t2 to about 5 volts for the remainder of the read operation to switch on the charge storage devices 212, 214 and 218. The lines 244 and 249 can also be raised from about 0 volts at time t2 to about 5 volts for the remainder of the read operation to switch on the SGS transistors 241 and 245 and the SGD transistor 243 to select the string 202 to be electrically coupled to the data line 252.

The electrical potential of the access line 236 of the selected charge storage device 216 can be raised from about 0 volts at time t2 to about 3 volts at time t3 and thereafter reduced three times, for example. The access line 236 can be reduced from about 3 volts to about 2 volts between times t5 and t6. The access line 236 can be reduced from about 2 volts to about 1 volt between times t7 and t8. The access line 236 can be reduced from about 1 volt to about 0 volts between times t9 and t10. The electrical potential of the access line 236 can thereby be reduced by voltage decrements, and the voltage decrements may be more or less than one volt according to various embodiments of the invention. The electrical potential of the access line 236 can be initially raised at approximately the same rate as the electrical potential of the access lines 232, 234 and 238. The electrical potential of the access line 236 can be reduced at a lower rate than it was raised.

The sense enable circuit 264 produces three successive pulses 320, 324 and 328, one pulse for each voltage decrement of the access line 236, to sense a state of a the charge storage device 216 during the read operation. The pulse 320 is produced between times t4 and t5 when the access line 236 is about 3 volts. The pulse 324 is produced between times t6 and t7 when the access line 236 is about 2 volts. The pulse 328 is produced between times t8 and t9 when the access line 236 is about 1 volt. The state of the data signal from the data line 252 is provided through the triggered inverter 258 and latched by the latch inverters 260 and 262 when the triggered inverter 258 is enabled by each pulse 320, 324 and 328 produced by the sense enable circuit 264. The state latched by the latch inverters 260 and 262 on the node 263 is shown in the timing diagram 300 as being either low or high depending on the state of the selected charge storage device 216. The I/O enable circuit 278 produces three pulses 340, 344 and 348 that follow, respectively, the pulses 320, 324 and 328 of the sense enable circuit 264. The pulses 340, 344 and 348 switch on the transistor 276 to couple the state latched by the latch inverters 260 and 262 on the node 263 to the I/O node 274.

The read operation can end between times t9 and t10. The control signal VREF rises from about 0.5 volts to about 2 volts to switch off the load transistor 256 and the control signal VCLAMP is reduced from about 1.5 volts to about 0 volts to switch off the bias transistor 254, such that the data line 252 and the selected string 202 are substantially isolated from the voltage supply Vcc node. In this phase of the read operation, the electrical potentials of the access lines 232, 234, 236 and 238 are reduced to approximately 0 volts. The lines 244 and 249 are reduced to approximately 0 volts to switch off the SGS transistors 241 and 245 and the SGD transistor 243.

FIGS. 4A, 4B and 4C are timing diagrams 410, 420 and 430 for the memory circuit of FIG. 2 according to various embodiments of the invention. The timing diagrams 410, 420 and 430 illustrate possible states for the electrical potential of the access line 236 of the selected charge storage device 216 during the read operation according to various embodiments of the invention. The timing diagrams 410, 420 and 430 are represented by voltage V on the vertical axis 302 and time t on the horizontal axis 304 of the timing diagram 300 shown in FIG. 3.

The timing diagram 410 shows the electrical potential of the access line 236 being raised during the read operation from about 0 volts at time t2 to about 3 volts at time t8 in voltage increments. The access line 236 is raised from about 0 volts to about 1 volt between times t2 and t3. The access line 236 is raised from about 1 volt to about 2 volts between times t5 and t6. The access line 236 is raised from about 2 volts to about 3 volts between times t7 and t8. At the end of the read operation, the access line 236 is reduced from about 3 volts to about 0 volts between times t9 and t10. The electrical potential of the access line 236 can be raised by voltage increments that are more or less than one volt according to various embodiments of the invention.

The timing diagram 420 shows the electrical potential of the access line 236 being raised during the read operation from about 0 volts at time t2 to about 3 volts at time t86 by voltage increments, specifically seven voltage increments. At the end of the read operation, the access line 236 is reduced from about 3 volts to about 0 volts between times t86 and t9. The electrical potential of the access line 236 can be raised by more or less than seven voltage increments according to various embodiments of the invention.

The timing diagram 430 shows the electrical potential of the access line 236 being raised during the read operation from about 0 volts at time t2 to about 3 volts at time t3 and then reduced by voltage decrements to about 0 volts at time t9. The electrical potential of the access line 236 is reduced by seven voltage decrements, although the electrical potential can be reduced by more or less than seven voltage decrements according to various embodiments of the invention.

In some embodiments, program verify operations can also be implemented with electrical potentials that may be different than those shown and described with respect to FIGS. 3, 4A, 4B and 4C.

Figure 5:
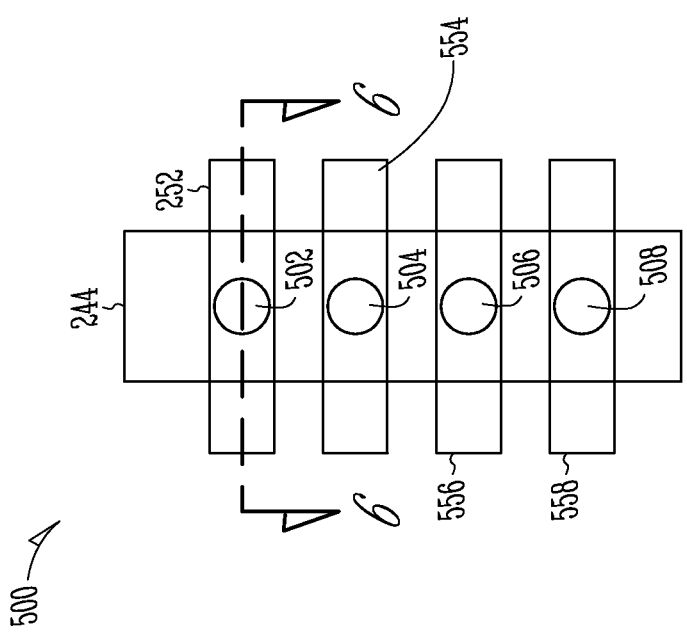
FIG. 5 is a top view of an apparatus in the form of a semiconductor construction according to various embodiments of the invention.

FIG. 5 is a top view of an apparatus in the form of a semiconductor construction 500 according to various embodiments of the invention. The semiconductor construction 500 is a portion of a larger semiconductor construction that includes the strings 202 and 206 of charge storage devices shown in FIG. 2. The semiconductor construction 500 includes four pillars 502, 504, 506 and 508 comprising a semiconductor material. For example, the pillars 502, 504, 506 and 508 may comprise polysilicon. Each of the pillars 502, 504, 506 and 508 provides a channel for multiple charge storage devices in a string in a NAND memory device. The SGD line 244 surrounds or partially surrounds the pillars 502, 504, 506 and 508 and will be further described with respect to FIG. 6.

Each of the pillars 502, 504, 506 and 508 is coupled to a respective data line 252, 554, 556 and 558 that may be used to sense a state of one of the charge storage devices associated with the pillars 502, 504, 506 and 508. The data line 252 is associated with the string 202 and the pillar 502. The data lines 252, 554, 556 and 558 may comprise, for example, polysilicon or metal, including one or more of cobalt (Co), titanium (Ti), tungsten (W), nickel (Ni) or tantalum (Ta) according to various embodiments of the invention. The semiconductor construction 500 can include different numbers of pillars 502, 504, 506 and 508 according to various embodiments of the invention.

Figure 6:
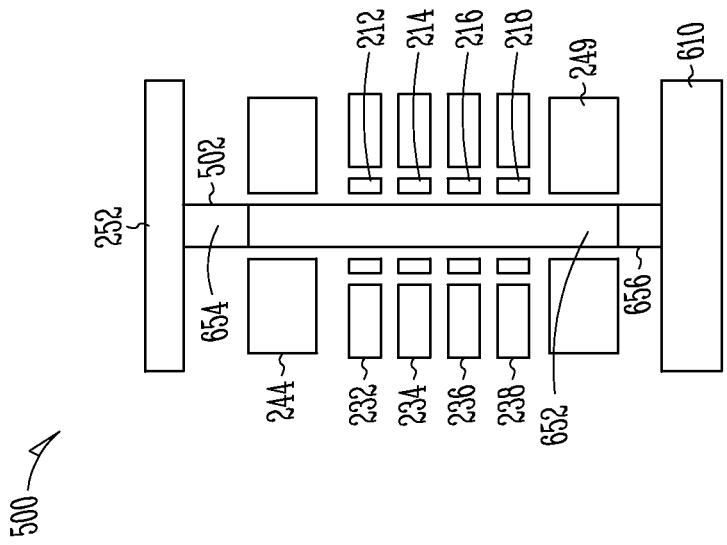
FIG. 6 is a cross-sectional view of the semiconductor construction of FIG. 5 according to various embodiments of the invention.

FIG. 6 is a cross-sectional view of the semiconductor construction 500 of FIG. 5 along line 6-6 according to various embodiments of the invention. The cross-sectional view of FIG. 6 illustrates the string 202. The pillar 502 extends from the data line 252 to a p-type common source 610. The charge storage devices 212, 214, 216 and 218 surround or partially surround the pillar 502 between the data line 252 and the common source 610. Regions of the pillar 502 between the charge storage devices 212, 214, 216 and 218 are source regions or drain regions of the charge storage devices 212, 214, 216 and 218. A number of tiers of metal or semiconductor material surround or partially surround the pillar 502 between the data line 252 and the common source 610. A majority of the tiers are access lines 232, 234, 236 and 238 to control the charge storage devices 212, 214, 216 and 218 that receive and release charge through the pillar 502.

A tier between the access line 232 and the data line 252 is the SGD line 244 that may be biased to substantially control conduction between the pillar 502 and the data line 252. A tier below the access line 238 is the SGS line 249 that may be biased to at least partially control conduction between the pillar 502 and the common source 610. The pillar 502 is surrounded or partially surrounded by the SGS line 249.

The charge storage devices 212, 214, 216 and 218, the access lines 232, 234, 236 and 238, the SGD line 244, the SGS line 249, the data line 252 and the common source 610 can be separated from each other by a dielectric such as, for example, silicon dioxide ($SiO_2$). The access lines 232, 234, 236 and 238, the SGD line 244 and the SGS line 249 may comprise tiers of a semiconductor material such as silicon or polysilicon or polysilicon doped with Phosphorous or Boron. The access lines 232, 234, 236 and 238, the SGD line 244 and the SGS line 249 may also comprise metal including one or more of Cobalt (Co), Titanium (Ti), Tungsten (W), Nickel (Ni) or Tantalum (Ta) according to various embodiments of the invention.

The access lines 232, 234, 236 and 238 can be used to control the charge storage devices 212, 214, 216 and 218 surrounding or partially surrounding the pillar 502. Each charge storage device 212, 214, 216 and 218 may comprise, for example, a floating gate transistor or a charge trap transistor and may be a single level charge storage device or a multilevel charge storage device. The SGD line 244 and the SGS line 249 can be used to control transistors surrounding or partially surrounding the pillar 502. The pillar 502 comprises p-type polysilicon 652 adjacent to the access lines 232, 234, 236 and 238, the SGD line 244 and the SGS line 249. The pillar 502 comprises first n-type polysilicon 654 between the p-type polysilicon 652 and the data line 252. The pillar 502 comprises second n-type polysilicon 656 between the p-type polysilicon 652 and the common source 610.

Referring to FIG. 5 and FIG. 6, the data lines 252, 554, 556 and 558 are associated with respective ones of the pillars 502, 504, 506 and 508. Each charge storage device 212, 214, 216 and 218 is associated with the pillar 502 and a respective one of the access lines 232, 234, 236 and 238. The SGD line 244 and the SGS line 249 are associated with all of the pillars 502, 504, 506 and 508. The access lines 232, 234, 236 and 238 are adjacent to each other, and each access line 232, 234, 236 and 238 is adjacent to at least one other access line 232, 234, 236 and 238.

Referring to FIG. 3, FIG. 5 and FIG. 6, bodies of the transistor associated with the SGD line 244, the transistor associated with the SGS line 249 and the charge storage devices 212, 214, 216 and 218 remain in a floating state when an electrical potential of a gate of one of the charge storage devices 212, 214, 216 and 218 is lower than an electrical potential of the common source 610 or the data line 252. When the access lines 232, 234, 236 and 238 are raised to a high electrical potential from times t2 to t3 as shown in FIG. 3, the bodies are substantially depleted so that the electrical potential of the bodies can be determined by the gate and source potentials. This results in greater confidence in the body potential and greater confidence in the threshold voltage of the charge storage devices 212, 214, 216 and 218.

Figure 7:
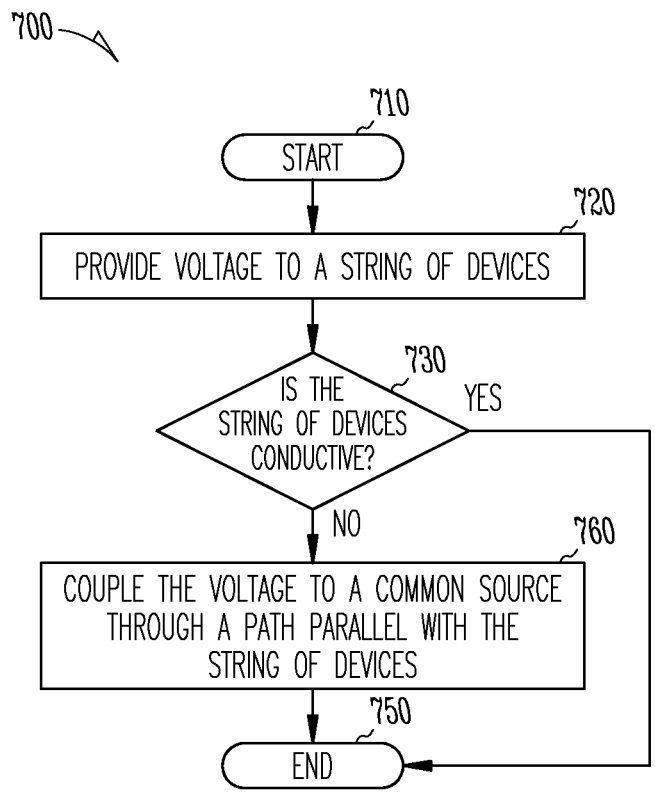
FIG. 7 is a flow diagram of a method according to various embodiments of the invention.

FIG. 7 is a flow diagram of a method 700 according to various embodiments of the invention. In block 710, the method 700 starts. In block 720, a voltage is provided to a string of devices. In block 730, the method 700 decides if the string of devices is conductive. If the string of devices is conductive, the method 700 ends in block 750. If the string of devices is not conductive, the voltage is coupled to a common source through a path parallel with the string of devices in block 760, thereby providing a load current to the common source through the parallel path. In block 750, the method 700 ends. Various embodiments may have more or fewer activities than those shown in FIG. 7. In some embodiments, the activities may be repeated, and/or performed in serial or parallel fashion. Some embodiments may comprise the same activities in a different order.

Figure 8:
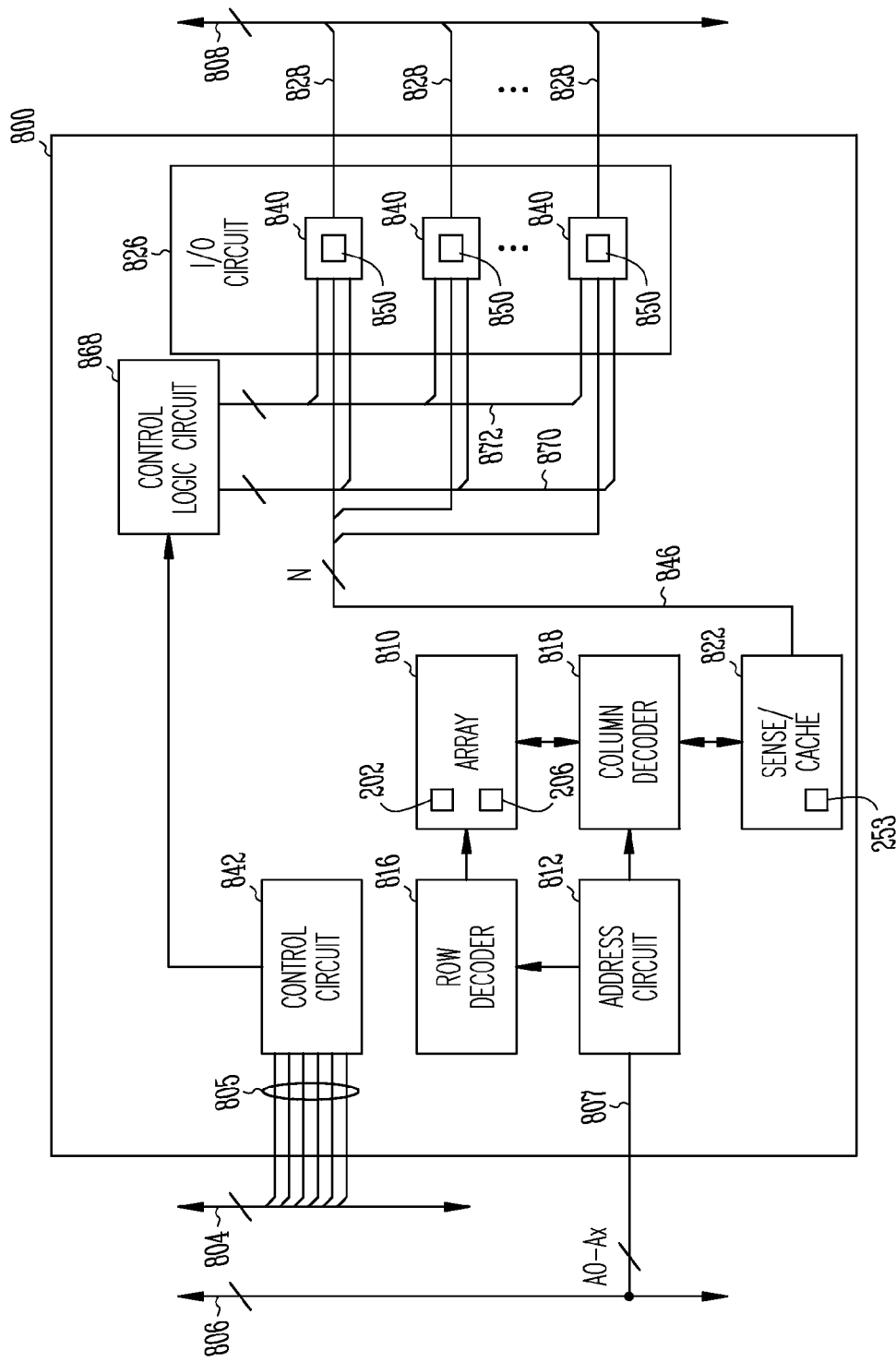
FIG. 8 is a block diagram of an apparatus in the form of a memory device according to various embodiments of the invention.

FIG. 8 is a block diagram of an apparatus in the form of a memory device 800 according to various embodiments of the invention. The memory device 800 is coupled to a control bus 804 to receive multiple control signals over control signal lines 805. The memory device 800 is also coupled to an address bus 806 to receive address signals A0-Ax on address signal lines 807 and to a data bus 808 to transmit and receive data signals. Although depicted as being received on separate physical busses, the signals could also be multiplexed and received on the same physical bus.

The memory device 800 includes one or more arrays 810 of memory cells that can be arranged in rows and in columns. The memory cells of the array 810 can be non-volatile memory cells (e.g., Flash memory cells with floating gate transistors or charge trap transistors) according to various embodiments of the invention. The memory device 800 can be a NAND memory device. The array 810 can include multiple banks and blocks of memory cells residing on a single die or on multiple dice as part of the memory device 800. The memory cells in the array 810 can be single level (SLC) or multilevel (MLC) memory cells. The array 810 includes the strings 202 and 206 of charge storage devices shown in FIG. 2 according to various embodiments of the invention.

An address circuit 812 can latch the address signals A0-Ax received on the address signal lines 807. The address signals A0-Ax can be decoded by a row decoder 816 and a column decoder 818 to access data stored in the array 810. The memory device 800 can read data in the array 810 by sensing voltage or current changes in memory cells in the array 810 using sense devices in a sense/cache circuit 822 including the sense and latch circuit 253 shown in FIG. 2 according to various embodiments of the invention.

A data input and output (I/O) circuit 826 implements bi-directional data communication over external (e.g., data I/O) nodes 828 coupled to the data bus 808. The I/O circuit 826 includes N driver and receiver circuits 840 according to various embodiments of the invention. The memory device 800 includes a controller that is configured to support operations of the memory device 800, such as writing data to and/or erasing data from the array 810. The controller can comprise, for example, control circuitry 842 (e.g., configured to implement a state machine) on a same or different die than that which includes the array 810 and/or any or all of the other components of the memory device 800. The controller can comprise the control circuitry 842, firmware, software or combinations of any or all of the foregoing. Data can be transferred between the sense/cache circuit 822 and the I/O circuit 826 over N signal lines 846.

Each driver and receiver circuit 840 includes a driver circuit 850. Control signals can be provided to the driver circuits 850 (e.g., through control logic circuit 868 that is coupled to the control circuitry 842). The control logic circuit 868 can provide the control signals over lines 870 and 872 to the driver circuits 850.

The use of sense and latch circuits, such as the sense and latch circuit 253 shown in FIG. 2, and methods described herein can operate to reduce noise in a sense operation, such as a read operation or a program verify operation. According to certain embodiments, a load current is switched from a string of charge storage devices to flow to a common source when data is sensed and latched that indicates that the string is not conductive. Using some embodiments of the invention described herein can result in a reduced change in current flowing to the common source before and after the data is sensed during a read operation or a program verify operation. Noise in the common source due to the data pattern in a memory device can be reduced, and noise in a data sensing margin for the memory device can be reduced. Embodiments of the invention described herein can improve the performance of memory devices with charge storage devices storing, for example, more than 2 bits or MLCs. This can lead to a significant performance improvement over conventional technology.

Although specific embodiments have been described, it will be evident that various modifications and changes may be made to these embodiments. Accordingly, the specification and drawings are to be regarded in an illustrative rather than a restrictive sense.

The Abstract of the Disclosure is provided to comply with 37 C.F.R. §1.72(b), requiring an abstract that allows the reader to quickly ascertain the nature of the technical disclosure. It is submitted with the understanding that it will not be used to interpret or limit the claims. In addition, in the foregoing Detailed Description, it may be seen that various features are grouped together in a single embodiment for the purpose of streamlining the disclosure. This method of disclosure is not to be interpreted as limiting the claims. Thus, the following claims are hereby incorporated into the Detailed Description, with each claim standing on its own as a separate embodiment.

What is claimed is:

1. An apparatus comprising:
a string of charge storage devices coupled to a common source;
a first switch coupled between the string of charge storage devices and a load current source;
a second switch coupled between the load current source and the common source;
a bias transistor coupled between the string of charge storage devices and the first switch; and
wherein the load current source comprises a load transistor coupled to a voltage supply node.

2. The apparatus of claim 1, further comprising a sense and latch circuit coupled to the string of charge storage devices, the sense and latch circuit to sense and latch a state of a selected charge storage device in the string of charge storage devices and to control the first switch and the second switch based on the state of the selected charge storage device.

3. The apparatus of claim 1, wherein the first switch comprises a transistor.

4. The apparatus of claim 3, wherein the first switch comprises a p-channel transistor.

5. The apparatus of claim 1, wherein the second switch comprises a transistor.

6. The apparatus of claim 5, wherein the second switch comprises an n-channel transistor.

7. The apparatus of claim 1, wherein the charge storage devices in the string of charge storage devices comprise multilevel charge storage devices and wherein the string of charge storage devices are coupled to the common source through a select transistor.

8. The apparatus of claim 1, wherein the charge storage devices in the string of charge storage devices are associated with a pillar comprising semiconductor material.

9. A method comprising:
providing a voltage to a string of charge storage devices coupled to a common source line;
sensing a state of a charge storage device in a string of charge storage devices coupled to a common source by latching the state of the charge storage device in the string of charge storage devices; and
providing the voltage to the common source through a path parallel with the string of charge storage devices if the string of charge storage devices is not conductive, wherein providing the voltage to the common source comprises controlling a transistor coupled to the common source and the voltage in response to the latched state of the charge storage device in the string of charge storage devices.

10. The method of claim 9, wherein sensing a state of a charge storage device comprises sensing a state of the charge storage device with a sense and latch circuit.

11. The method of claim 10, wherein providing the voltage to the common source through a path comprises switching on a transistor coupled to the common source and the voltage.

12. The method of claim 9, wherein providing a voltage further comprises coupling a voltage supply to the string of charge storage devices through a load transistor.

13. An apparatus comprising:
a plurality of strings, each string comprising a plurality of charge storage devices coupled in series to a common source;
a sense and latch circuit coupled to a selected one of the strings to sense and latch a state of a selected charge storage device in the selected one of the strings;
a first switch coupled between a load current source and the common source to selectively couple the load current source to the common source in response to the latched state of the selected charge storage device;
a bias transistor coupled between the plurality of strings of charge storage devices and the first switch; and
wherein the load current source comprises a load transistor coupled to a voltage supply node.

14. The apparatus of claim 13, further comprising a second switch coupled between the load current source and the plurality of strings to selectively couple the load current source to the plurality of strings.

15. The apparatus of claim 14, wherein:
the first switch comprises an n-channel transistor; and
the second switch comprises a p-channel transistor.

16. The apparatus of claim 13, wherein each charge storage device comprises a charge trap transistor.

17. The apparatus of claim 13, wherein each charge storage device comprises a floating gate transistor.

18. The apparatus of claim 13, wherein the apparatus comprises a system.

19. The apparatus of claim 13, wherein the apparatus comprises a flash memory device.

20. The apparatus of claim 13, wherein the apparatus comprises a NOT AND (NAND) memory device.

21. The apparatus of claim 13, wherein each string comprises a pillar comprising semiconductor material, the plurality of charge storage devices being associated with the pillar.

22. The apparatus of claim 13, further comprising, for each of the strings:
- a drain select transistor coupled between the charge storage devices and the sense and latch circuit; and
- a source select transistor coupled between the charge storage devices and the common source.

23. A method comprising:
- providing a voltage to a string of charge storage devices coupled to a common source line;
- sensing a state of a charge storage device, in a string of charge storage devices coupled to a common source, by:
  - raising an electrical potential of control gates of other charge storage devices in the string;
  - lowering an electrical potential of a control gate of the charge storage device in the string of charge storage devices; and
  - sensing the state of the charge storage device in the string of charge storage devices; and
- providing the voltage to the common source through a path parallel with the string of charge storage devices if the string of charge storage devices is not conductive.

\* \* \* \* \*